(12) United States Patent
Yamaguchi et al.

(10) Patent No.: US 12,217,816 B2
(45) Date of Patent: Feb. 4, 2025

(54) SEMICONDUCTOR WIRING DEVICE AND METHOD

(71) Applicant: Micron Technology, Inc., Boise, ID (US)

(72) Inventors: Hidenori Yamaguchi, Higashihiroshima (JP); Keizo Kawakita, Higashi Hiroshima (JP)

(73) Assignee: Micron Technology, Inc., Boise, ID (US)

( * ) Notice: Subject to any disclaimer, the term of this patent is extended or adjusted under 35 U.S.C. 154(b) by 172 days.

(21) Appl. No.: 17/823,173

(22) Filed: Aug. 30, 2022

(65) Prior Publication Data

US 2024/0071425 A1    Feb. 29, 2024

(51) Int. Cl.
*G11C 5/00*    (2006.01)
*G11C 5/06*    (2006.01)
(Continued)

(52) U.S. Cl.
CPC .............. *G11C 5/06* (2013.01); *G11C 7/1006* (2013.01); *G11C 16/06* (2013.01); *H10B 43/35* (2023.02)

(58) Field of Classification Search
CPC ... G11C 11/4097; G11C 7/18; G11C 11/4099; G11C 2211/4013; G11C 5/025; G11C 7/14; G11C 16/06; G11C 5/06; G11C 7/1006; G11C 11/161; G11C 11/1675; H01L 29/792; H01L 29/40117; H01L 29/4234; H01L 29/42344; H01L 29/66833; H01L 27/0207; H01L 21/76843; H01L 2224/11464; H01L 2224/11912; H01L 2224/13014; H01L 2224/13016; H01L 2224/13082; H01L 2224/13147; H01L 2224/13155; H01L 2224/1403; H01L 2224/14051; H01L 2224/14134; H01L 2224/14154; H01L 2224/14177; H01L 2224/14181; H01L 2224/16145; H01L 2225/06513; H01L 23/535; H01L 24/11; H01L 24/13; H01L 24/14; H01L 24/16; H01L 25/0657; H01L 25/18; H01L 27/0886; H01L 29/0642; H01L 29/42328; H01L 29/517; H01L 29/66795;
(Continued)

(56) References Cited

U.S. PATENT DOCUMENTS

| | | | |
|---|---|---|---|
| 5,389,735 A * | 2/1995 | Bockelman | H01P 3/081 174/33 |
| 10,608,310 B1 * | 3/2020 | Morton | H01P 1/218 |

OTHER PUBLICATIONS

"Chinese Application Serial No. 202311095907.6, Notification to Make Rectification mailed Sep. 21, 2023", with machine English translation, 2 pages.

* cited by examiner

*Primary Examiner* — Thong Q Le
(74) *Attorney, Agent, or Firm* — Schwegman Lundberg & Woessner, P.A.

(57) ABSTRACT

Apparatus and methods are disclosed, including transistors, semiconductor devices and systems. Example semiconductor devices and methods include a first transmission line and a second transmission line located over one another. A via is shown connecting the first transmission line and a second transmission line wherein a first side of the via and a side of the second transmission line are coplanar. A via is also shown connecting the first transmission line and a second transmission line wherein the second transmission line tapers downward from a line width to a via width.

17 Claims, 7 Drawing Sheets

(51) Int. Cl.
   *G11C 7/10* (2006.01)
   *G11C 16/06* (2006.01)
   *H10B 43/35* (2023.01)
(58) Field of Classification Search
   CPC . H01L 29/785; H01L 29/7881; H01L 29/861;
   H01L 2924/1431; H01L 2924/1436;
   H01L 21/76224
   See application file for complete search history.

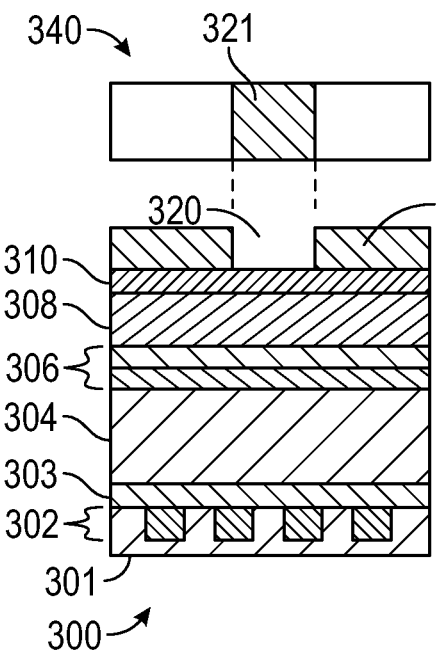
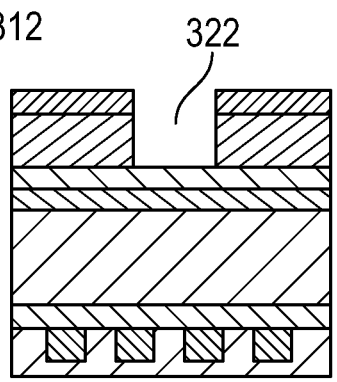
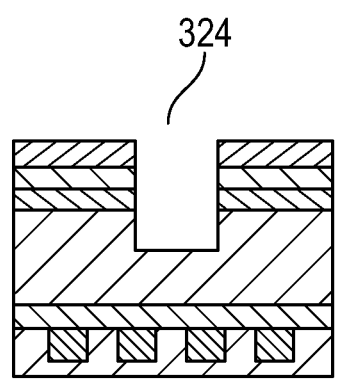
FIG. 3A  FIG. 3B  FIG. 3C
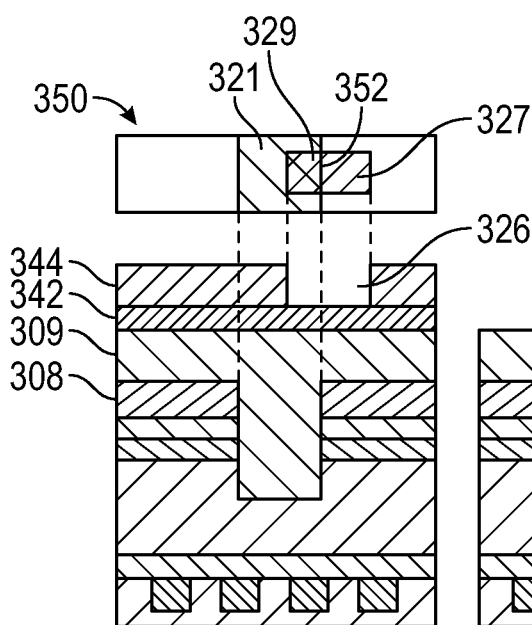
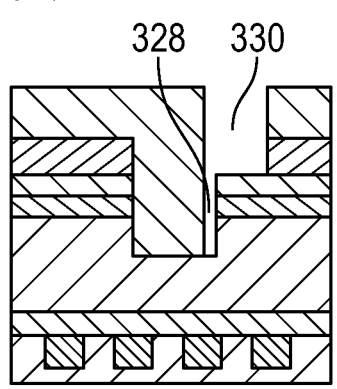
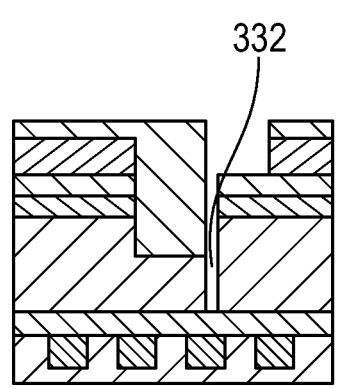
FIG. 3D  FIG. 3E  FIG. 3F

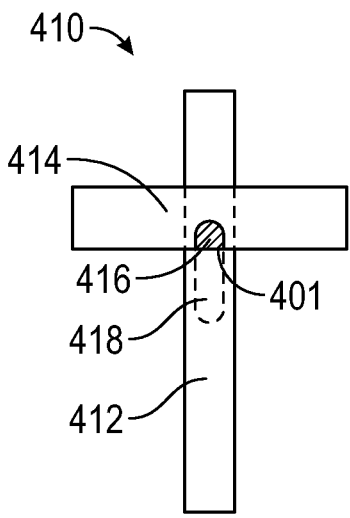 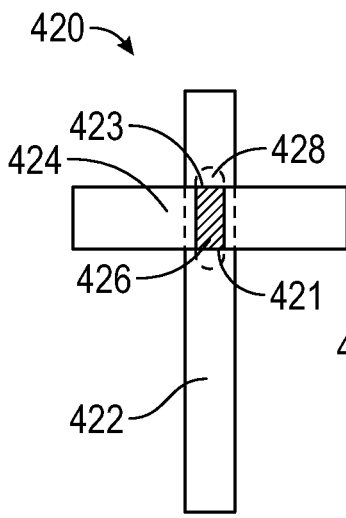 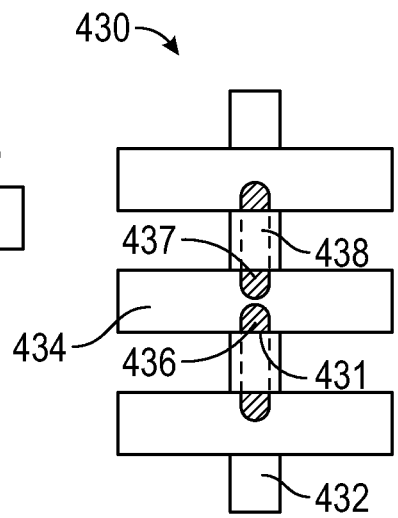
FIG. 4A  FIG. 4B  FIG. 4C
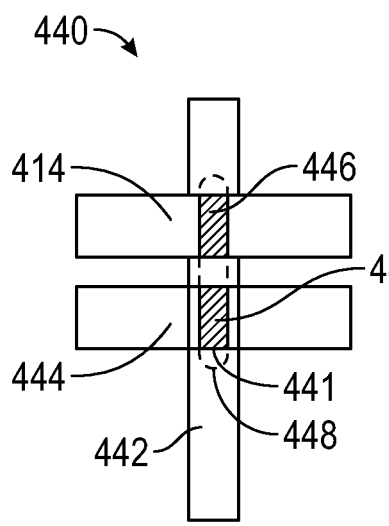 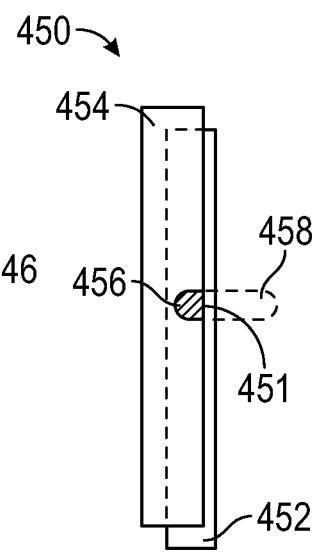 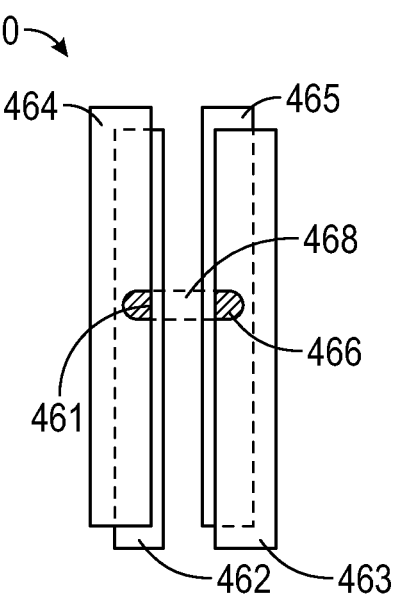
FIG. 4D  FIG. 4E  FIG. 4F

SEMICONDUCTOR WIRING DEVICE AND METHOD

BACKGROUND

Memory devices are semiconductor circuits that provide electronic storage of data for a host system (e.g., a computer or other electronic device). Memory devices may be volatile or non-volatile. Volatile memory requires power to maintain data, and includes devices such as random-access memory (RAM), static random-access memory (SRAM), dynamic random-access memory (DRAM), or synchronous dynamic random-access memory (SDRAM), among others. Non-volatile memory can retain stored data when not powered, and includes devices such as flash memory, read-only memory (ROM), electrically erasable programmable ROM (EEPROM), erasable programmable ROM (EPROM), resistance variable memory, such as phase change random access memory (PCRAM), resistive random-access memory (RRAM), or magnetoresistive random access memory (MRAM), among others.

Host systems typically include a host processor, a first amount of main memory (e.g., often volatile memory, such as DRAM) to support the host processor, and one or more storage systems (e.g., often non-volatile memory, such as flash memory) that provide additional storage to retain data in addition to or separate from the main memory.

A storage system, such as a solid-state drive (SSD), can include a memory controller and one or more memory devices, including a number of dies or logical units (LUNs). In certain examples, each die can include a number of memory arrays and peripheral circuitry thereon, such as die logic or a die processor. The memory controller can include interface circuitry configured to communicate with a host device (e.g., the host processor or interface circuitry) through a communication interface (e.g., a bidirectional parallel or serial communication interface).

The present description relates generally to transmission line structures and interconnecting vias and manufacture.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

FIG. 3A illustrates a stage in manufacture of a semiconductor device in accordance with some example embodiments.

FIG. 3B illustrates a stage in manufacture of a semiconductor device in accordance with some example embodiments.

FIG. 3C illustrates a stage in manufacture of a semiconductor device in accordance with some example embodiments.

FIG. 3D illustrates a stage in manufacture of a semiconductor device in accordance with some example embodiments.

FIG. 3E illustrates a stage in manufacture of a semiconductor device in accordance with some example embodiments.

FIG. 3F illustrates a stage in manufacture of a semiconductor device in accordance with some example embodiments.

FIG. 4A illustrates transmission lines and a via of a semiconductor device in accordance with some example embodiments.

FIG. 4B illustrates transmission lines and a via of a semiconductor device in accordance with some example embodiments.

FIG. 4C illustrates transmission lines and a via of a semiconductor device in accordance with some example embodiments.

FIG. 4D illustrates transmission lines and a via of a semiconductor device in accordance with some example embodiments.

FIG. 4E illustrates transmission lines and a via of a semiconductor device in accordance with some example embodiments.

FIG. 4F illustrates transmission lines and a via of a semiconductor device in accordance with some example embodiments.

DETAILED DESCRIPTION

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

Figure 1:
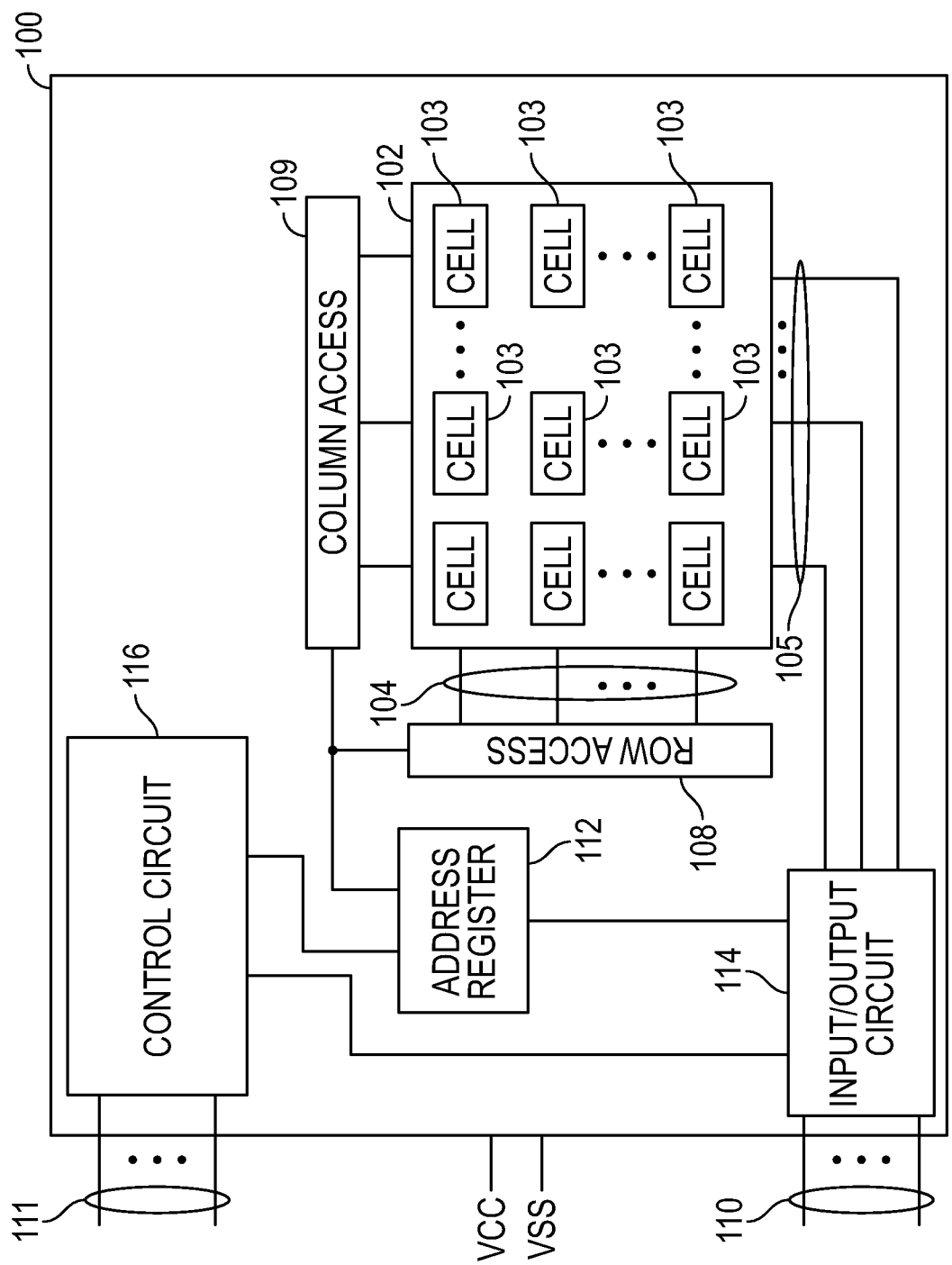
FIG. 1 illustrates a memory device in accordance with some example embodiments.

FIG. 1 shows a block diagram of an apparatus in the form of a memory device 100, according to an embodiment of the invention. Memory device 100 can include a memory array 102 having memory cells 103 that can be arranged in rows and columns along with lines (e.g., access lines) 104 and lines (e.g., data lines) 105. Memory device 100 can use lines 104 to access memory cells 103 and lines 105 to exchange information with memory cells 103.

Memory cells 103 and other circuits 114, 116, etc. may include transistors and utilize methods as described in more detail in FIGS. 2-7. In one example, memory arrays 102 include NAND storage array, and peripheral circuits such as circuits 114, 116, 108, 109, etc. may include transistors as described in more detail in FIGS. 2-7.

Row access 108 and column access 109 circuitry can respond to an address register 112 to access memory cells 103 based on row address and column address signals on lines 110, 111, or both. A data input/output circuit 114 can be configured to exchange information between memory cells 103 and lines 110. Lines 110 and 111 can include nodes within memory device 100 or pins (or solder balls) on a package where memory device 100 can reside.

A control circuit 116 can control operations of memory device 100 based on signals present on lines 110 and 111. A device (e.g., a processor or a memory controller) external to memory device 100 can send different commands (e.g., read, write, or erase commands) to memory device 100 using different combinations of signals on lines 110, 111, or both.

Memory device 100 can respond to commands to perform memory operations on memory cells 103, such as performing a read operation to read information from memory cells 103 or performing a write (e.g., programming) operation to store (e.g., program) information into memory cells 103. Memory device 100 can also perform an erase operation to clear information from some or all of memory cells 103.

Memory device 100 can receive a supply voltage, including supply voltages Vcc and Vss. Supply voltage Vss can operate at a ground potential (e.g., having a value of approximately zero volts). Supply voltage Vcc can include an external voltage supplied to memory device 100 from an external power source such as a battery or an alternating-current to direct-current (AC-DC) converter circuitry.

Each of memory cells 103 can be programmed to store information representing a value of a fraction of a bit, a value of a single bit, or a value of multiple bits such as two, three, four, or another number of bits. For example, each of memory cells 103 can be programmed to store information representing a binary value "0" or "1" of a single bit. The single bit per cell is sometimes called a single level cell. In another example, each of memory cells 103 can be programmed to store information representing a value for multiple bits, such as one of four possible values "00," "01," "10," and "11" of two bits, one of eight possible values "000," "001," "010," "011," "100," "101," "110," and "111" of three bits, or one of other values of another number of multiple bits. A cell that has the ability to store multiple bits is sometimes called a multi-level cell (or multi-state cell).

Memory device 100 can include a non-volatile memory device, and memory cells 103 can include non-volatile memory cells, such that memory cells 103 can retain information stored thereon when power (e.g., Vcc, Vss, or both) is disconnected from memory device 100. For example, memory device 100 can be a flash memory device, such as a NAND flash or a NOR flash memory device, or another kind of memory device, such as a variable resistance memory device (e.g., a phase change or resistive RAM device).

Memory device 100 can include a memory device where memory cells 103 can be physically located in multiple levels on the same device, such that some of memory cells 103 can be stacked over some other memory cells 103 in multiple levels over a substrate (e.g., a semiconductor substrate) of memory device 100.

In one example, memory device 100 is fabricated on a semiconductor die. In addition to memory cells 103 and other circuitry to operate cells 103, the semiconductor die includes one or more levels of transmission lines located on an active side of the die. In one example, transmission lines and vias as described below are included with the memory device 100.

One of ordinary skill in the art will recognize that memory device 100 may include other elements, several of which are not shown in FIG. 1, so as not to obscure the example embodiments described herein.

Figure 2:
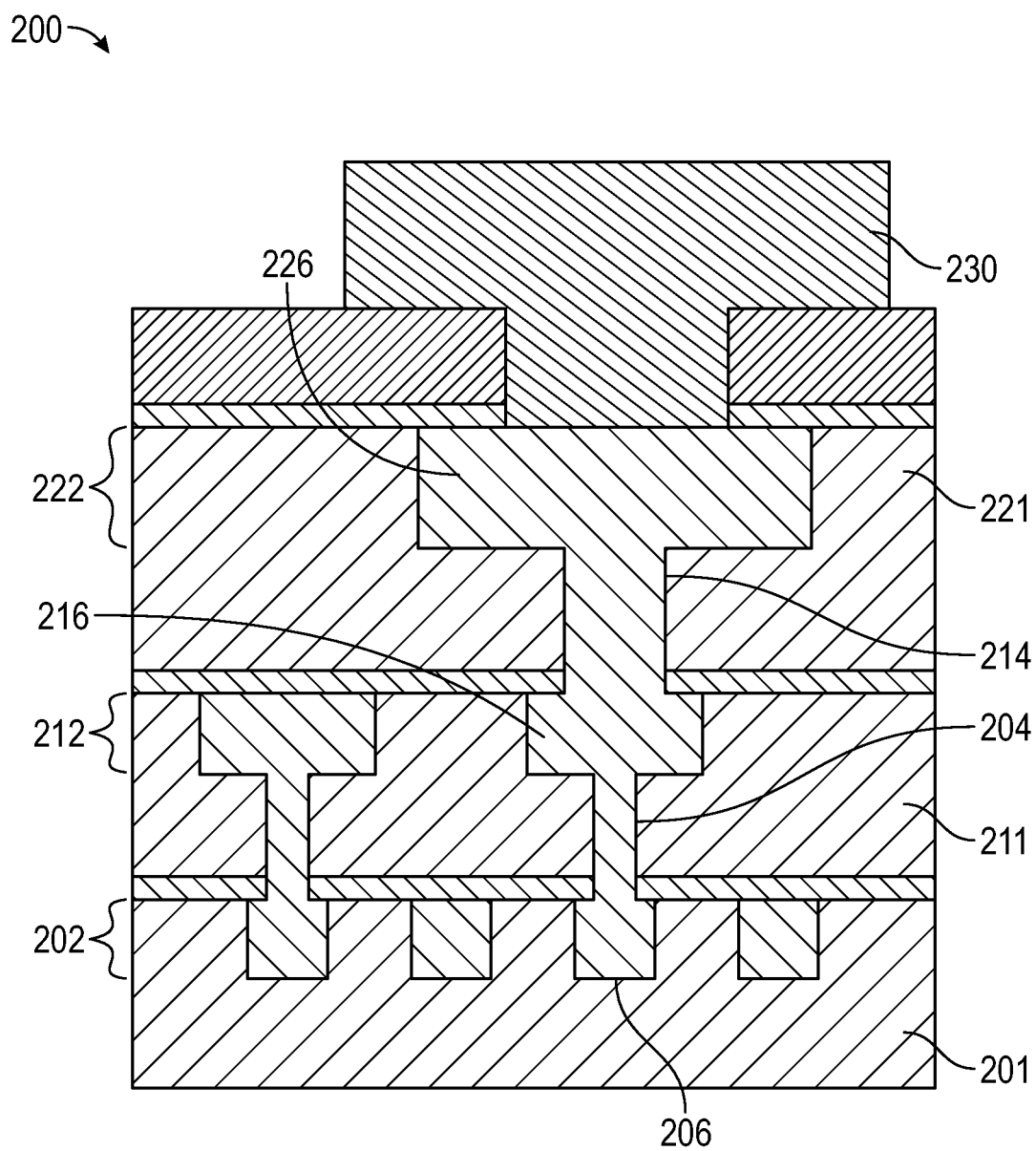
FIG. 2 illustrates a portion of a semiconductor device including transmission lines and vias in accordance with some example embodiments.

FIG. 2 shows levels of transmission lines and vias of a semiconductor device 200 in one example. The device 200 includes a first transmission line level 202 formed in a first layer 201 of a die. A second transmission line level 212 is formed in a second layer 211 of the die. A third transmission line level 222 is formed in a third layer 221 of the die. A first level transmission line 206 is shown coupled to a second level transmission line 216 through a first via 204. The second level transmission line 216 is shown coupled to a third level transmission line 226 through a second via 214. An external connection 230 such as a solder pad or other connection is shown on a top surface of the semiconductor device 200.

In manufacturing, it can be difficult to form vias that are small enough to align with transmission lines as shown in FIG. 2. It can also be challenging to accurately locate vias over transmission lines as shown in FIG. 2. Examples of vias and transmission lines described below address these and other challenges.

Figures 3G, 3H, 3I:
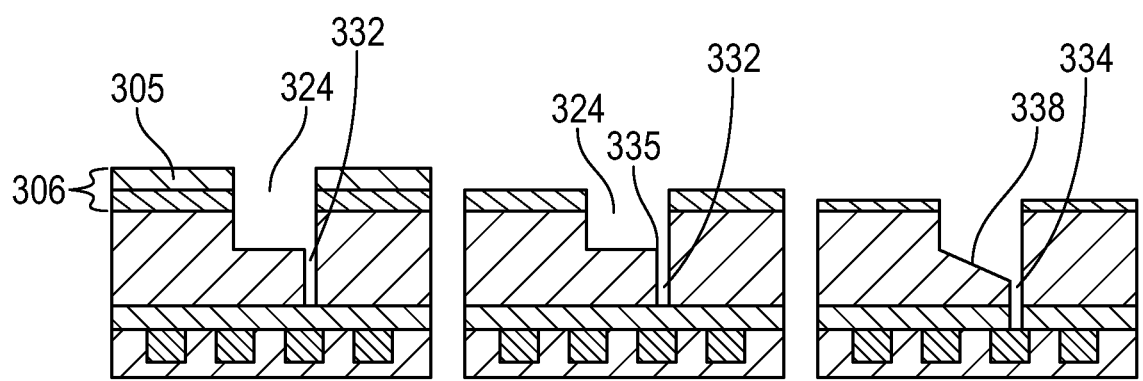
FIG. 3G illustrates a stage in manufacture of a semiconductor device in accordance with some example embodiments.
FIG. 3H illustrates a stage in manufacture of a semiconductor device in accordance with some example embodiments.
FIG. 3I illustrates a stage in manufacture of a semiconductor device in accordance with some example embodiments.

FIGS. 3A-3J show selected manufacturing stages to form vias and transmission lines. In FIG. 3A a first transmission line level 302 formed in a first layer 301 of a die. A dielectric layer 304 is located over the first transmission line level 302, with a first stop layer 303 located between the dielectric layer 304 and the first transmission line level 302. A second stop structure 306 is shown above the dielectric layer 304. In the example shown, the second stop structure 306 includes multiple stop layers that provide a removal process stop for different material removal operations.

A first underlayer 308 and a third stop layer 310 are shown located over the second stop structure 306. A photoresist layer 312 is shown on top of the third stop layer 310. A block diagram of a phototool 340 is shown, with a first pattern 321. As illustrated in FIG. 3A, the first pattern 321 of the phototool 340 defines a region of the photoresist layer 312 to be removed, and forms a first cavity 320.

In FIG. 3B, the first cavity 320 is used to mask the first underlayer 308 and the third stop layer 310, and a second cavity 322 is formed as defined by the first cavity 320. In FIG. 3C, a third cavity 324 is formed as defined by the second cavity 322. The third cavity 324 is formed after selected removal of a portion of the second stop structure 306. The third stop layer 310 is also removed at this stage, and a portion of the first underlayer 308.

FIG. 3D shows an additional second underlayer 309 that fills the third cavity 324, and a fourth stop layer 342. A second photoresist layer 344 is formed over the fourth stop layer 342. A block diagram of a second phototool 350 is shown, with a second pattern 327. An alignment between the first pattern 321 and the second pattern 327 is shown for reference in the block diagram of the second phototool 350. An overlapping portion 329 of the first pattern 321 and the second pattern 327 is shown. As illustrated in FIG. 3D, the second pattern 327 of the second phototool 350 defines a region of the second photoresist layer 344 to be removed, and forms a fourth cavity 326.

In FIG. 3E, the fourth cavity 326 is used to mask the portion of the first underlayer 308 and the fourth stop layer 342. Due to the alignment between the first pattern 321 and the second pattern 327, a fifth cavity 328 and a sixth cavity 330 are formed as defined by the fourth cavity 326. The fifth cavity 328 is defined by the overlapping portion 329 from FIG. 3D. In FIG. 3F, a seventh cavity 332 is formed to deepen the fifth cavity 328 and reach the first stop layer 303. In forming the seventh cavity 332, a portion of the second underlayer 309 is also removed.

In FIG. 3G, the first underlayer 308 and second underlayer 309 are removed. The previously formed third cavity 324 is opened up. Due to the formation process and overlapping portion 329 as described above, a side of the seventh cavity 332 and a side of the third cavity 324 are coplanar.

In FIG. 3H, a top layer 305 of the second stop structure 306 is removed. In FIG. 3I, the exposed third cavity 324 and seventh cavity 332 are etched, and the first stop layer 303 is penetrated to form eight cavity 334. Because the exposed third cavity 324 and the seventh cavity 332 form an exposed corner 335, etching will happen from both exposed surfaces. As a result, a downward taper 338 forms while the eight cavity 334 is being formed. Although a straight-line downward taper 338 is shown, in practice the downward taper 338 may have other tapering downward contours that are not completely linear. An arcuate downward taper 338 and other downward taper contours are also within the scope of the invention.

Figure 3J:
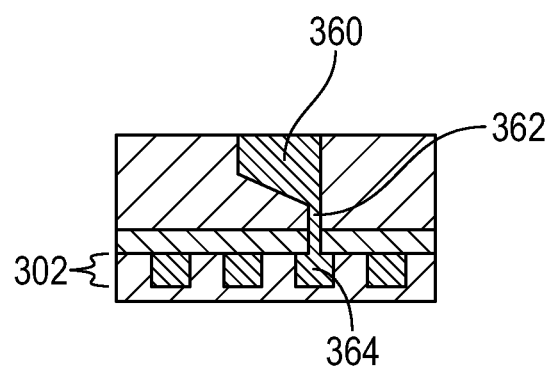
FIG. 3J illustrates a stage in manufacture of a semiconductor device in accordance with some example embodiments.

In FIG. 3J, the third cavity 324, the downward taper 338 and the eight cavity 334 are filled with conductor material to form a second transmission line 360 and a via 362 that couples the second transmission line 360 to a first transmission line 364 in the first transmission line level 302. In one example, the conductor material includes copper, although the invention is not so limited. Other conductors, such as aluminum or other metals or metal alloys are also within the scope of the invention.

FIG. 4A-4F show some examples of second transmission lines, first transmission lines, and vias that are formed as described in FIGS. 3A-3J as discussed above. In FIG. 4A, a first transmission line 412 and a second transmission line 414 are coupled together by a via 416 that was formed by one or more methods as described in the present disclosure. In the example of FIG. 4A, the first transmission line 412 is located below the second transmission line 414. In one example the second transmission line 414 is formed in an operation similar to the filling of the third cavity 324 from FIG. 3J. In one example, the via 416 is formed in an operation similar to the filling of the eight cavity 334 from FIG. 3J. In one example, the second transmission line 414 and the via 416 are filled in a single operation similar to a dual damascene operation, and the two structures will be integral, with no discernable boundary between the second transmission line 414 and the via 416. As noted above, due to the fabrication process, a first side 401 of the via 416 and a side of the second transmission line 414 are coplanar. A portion 418 of a second pattern of a second phototool, similar to second pattern 327 from FIG. 3D is shown in ghost lines to indicate how only an overlapping portion of phototools is used to create the via 416. This allows a larger, more relaxed manufacturing process with a second pattern of a second phototool that does not have to be very small and precisely located at an intersection between the first transmission line 412 and the second transmission 414.

FIG. 4B shows another configuration of second transmission lines, first transmission lines, and vias that are formed as described in FIGS. 3A-3J. In FIG. 4B, a first transmission line 422 and a second transmission line 424 are coupled together by a via 426 that was formed by one or more methods as described in the present disclosure. In the example of FIG. 4B, the first transmission line 422 is located below the second transmission line 424. As noted above, due to the fabrication process, a first side 421 of the via 426 and a side of the second transmission line 424 are coplanar. A portion 428 of a second pattern of a second phototool, similar to second pattern 327 from FIG. 3D is shown in ghost lines to indicate how only an overlapping portion of phototools is used to create the via 426. In the example of FIG. 4B, a single second pattern of a second phototool 428 overlaps both opposing sides of the second transmission line 424. The example of FIG. 4B provides a second straight side 423 opposite the first side 421 of the via 426. In the example of FIG. 4B, the via 426 is substantially rectangular. In the example of FIG. 4B, the via 426 has a width equal to a line width of the second transmission line 424.

FIG. 4C shows another configuration of second transmission lines, first transmission lines, and vias that are formed as described in FIGS. 3A-3J. In FIG. 4C, a first transmission line 432 and a second transmission line 434 are coupled together by a via 436 that was formed by one or more methods as described in the present disclosure. In the example of FIG. 4C, the first transmission line 432 is located below the second transmission line 434. As noted above, due to the fabrication process, a first side 431 of the via 436 and a side of the second transmission line 434 are coplanar. A portion 438 of a second pattern of a second phototool, similar to second pattern 327 from FIG. 3D is shown in ghost lines to indicate how only an overlapping portion of phototools is used to create the via 436. The example of FIG. 4C provides a second via 437 with a second straight side opposite the first side 411 of the via 436. In the example of FIG. 4C, two different vias 436, 437 are formed by two different second patterns of second phototools 438 and a single intersection between the first transmission line 432 and the second transmission line 434 utilizes two vias 436, 437.

FIG. 4D shows another configuration of second transmission lines, first transmission lines, and vias that are formed as described in FIGS. 3A-3J. In FIG. 4D, a first transmission line 442 and a second transmission line 444 are coupled together by a via 446 that was formed by one or more methods as described in the present disclosure. In the example of FIG. 4D, the first transmission line 442 is located below the second transmission line 444. As noted above, due to the fabrication process, a first side 441 of the via 446 and a side of the second transmission line 444 are coplanar. A portion 448 of a second pattern of a second phototool, similar to second pattern 327 from FIG. 3D is shown in ghost lines to indicate how only an overlapping portion of phototools is used to create the via 446. In the example of FIG. 4D, a single second pattern of second phototool 448 forms two separate vias 446 with two separate second transmission lines 444. Similar to the example of FIG. 4B, the vias 446 are substantially rectangular, and have a width equal to a line width of the second transmission lines 444.

FIG. 4E shows another configuration of second transmission lines, first transmission lines, and vias that are formed as described in FIGS. 3A-3J. In FIG. 4E, a first transmission line 452 and a second transmission line 454 are coupled together by a via 456 that was formed by one or more methods as described in the present disclosure. In the example of FIG. 4E, the first transmission line 452 is located below the second transmission line 454. As noted above, due to the fabrication process, a first side 451 of the via 456 and a side of the second transmission line 454 are coplanar. A portion 458 of a second pattern of a second phototool, similar to second pattern 327 from FIG. 3D is shown in ghost lines to indicate how only an overlapping portion of phototools is used to create the via 456. In the example of FIG. 4E, the first transmission line 452 and the second transmission line 454 are parallel, in contrast to the orthogonal first transmission line and second transmission line of FIGS. 4A-4E. Although orthogonal and parallel examples are shown, the invention is not so limited. Other orientations such as intersecting at non orthogonal angles, are within the scope of the invention.

FIG. 4F shows another configuration of second transmission lines, first transmission lines, and vias that are formed as described in FIGS. 3A-3J. In FIG. 4F, a first transmission line 462 and a second transmission line 464 are coupled together by a via 466 that was formed by one or more methods as described in the present disclosure. In the example of FIG. 4F, the first transmission line 462 is located below the second transmission line 464. As noted above, due to the fabrication process, a first side 461 of the via 466 and a side of the second transmission line 464 are coplanar. A portion 468 of a second pattern of a second phototool, similar to second pattern 327 from FIG. 3D is shown in ghost lines to indicate how only an overlapping portion of phototools is used to create the via 466. In the example of FIG. 4F, the first transmission line 462 and the second transmission line 464 are parallel. In the example of FIG. 4F, a single second pattern of second phototool 468 forms two separate vias 466 with two separate second transmission lines 464.

Figure 5:
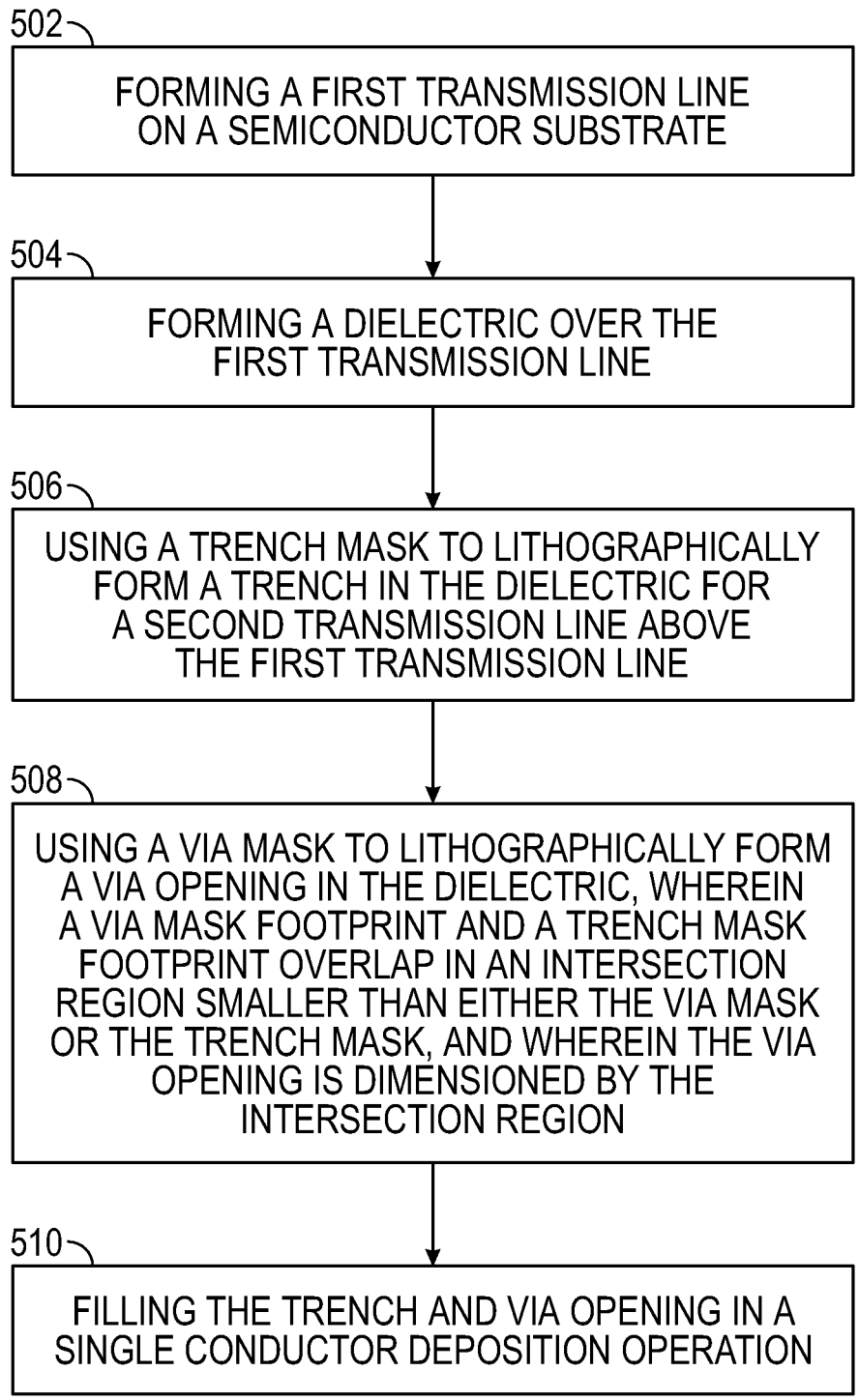
FIG. 5 illustrates an example method flow diagram in accordance with other example embodiments.

FIG. 5 shows a flow diagram of one example method of manufacture. In operation 502, a first transmission line is formed on a semiconductor substrate. In operation 504, a dielectric is formed over the first transmission line. In operation 506, a trench mask is used to lithographically form a trench in the dielectric for a second transmission line above the first transmission line. In operation 508, a via mask is used to lithographically form a via opening in the dielectric, wherein a via mask footprint and a trench mask footprint overlap in an intersection region smaller than either the via mask or the trench mask, and wherein the via opening is dimensioned by the intersection region. In operation 510, the trench and via opening are filled in a single conductor deposition operation.

Figure 6:
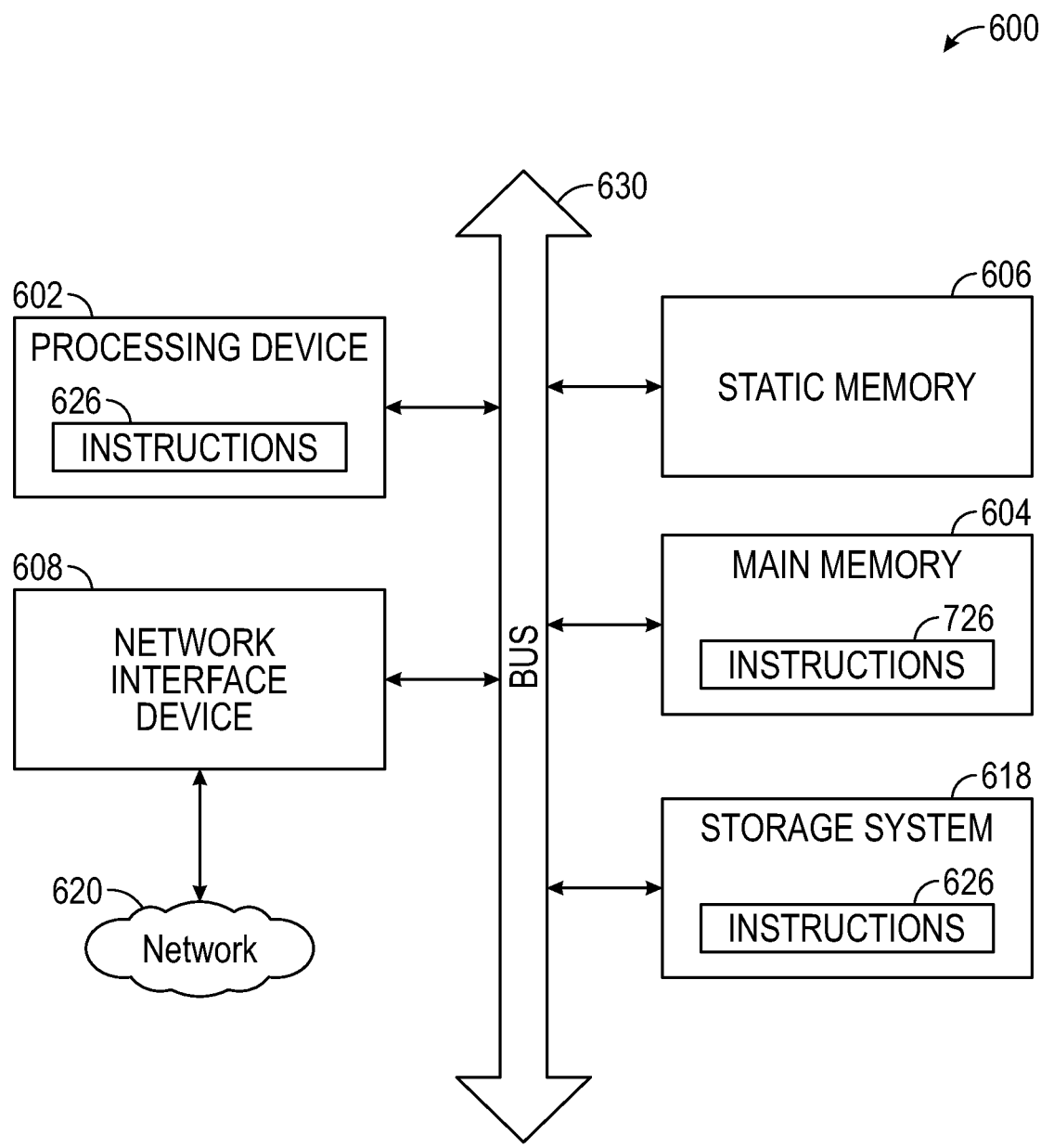
FIG. 6 illustrates an example block diagram of an information handling system in accordance with some example embodiments.

FIG. 6 illustrates a block diagram of an example machine (e.g., a host system) 900 which may include one or more transmission lines and vias, memory devices and/or memory systems as described above. As discussed above, machine 900 may benefit from enhanced memory performance from use of one or more of the described transistor structures and/or memory systems, facilitating improved performance of machine 900 (as for many such machines or systems, efficient reading and writing of memory can facilitate improved performance of a processor or other components that machine, as described further below.

In alternative embodiments, the machine 900 may operate as a standalone device or may be connected (e.g., networked) to other machines. In a networked deployment, the machine 900 may operate in the capacity of a server machine, a client machine, or both in server-client network environments. In an example, the machine 900 may act as a peer machine in peer-to-peer (P2P) (or other distributed) network environment. The machine 900 may be a personal computer (PC), a tablet PC, a set-top box (STB), a personal digital assistant (PDA), a mobile telephone, a web appliance, an IoT device, automotive system, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations.

Examples, as described herein, may include, or may operate by, logic, components, devices, packages, or mechanisms. Circuitry is a collection (e.g., set) of circuits implemented in tangible entities that include hardware (e.g., simple circuits, gates, logic, etc.). Circuitry membership may be flexible over time and underlying hardware variability. Circuitries include members that may, alone or in combination, perform specific tasks when operating. In an example, hardware of the circuitry may be immutably designed to carry out a specific operation (e.g., hardwired). In an example, the hardware of the circuitry may include variably connected physical components (e.g., execution units, transistors, simple circuits, etc.) including a computer-readable medium physically modified (e.g., magnetically, electrically, moveable placement of invariant massed particles, etc.) to encode instructions of the specific operation. In connecting the physical components, the underlying electrical properties of a hardware constituent are changed, for example, from an insulator to a conductor or vice versa. The instructions enable participating hardware (e.g., the execution units or a loading mechanism) to create members of the circuitry in hardware via the variable connections to carry out portions of the specific tasks when in operation. Accordingly, the computer-readable medium is communicatively coupled to the other components of the circuitry when the device is operating. In an example, any of the physical components may be used in more than one member of more than one circuitry. For example, under operation, execution units may be used in a first circuit of a first circuitry at one point in time and reused by a second circuit in the first circuitry, or by a third circuit in a second circuitry at a different time.

The machine (e.g., computer system, a host system, etc.) 900 may include a processing device 902 (e.g., a hardware processor, a central processing unit (CPU), a graphics processing unit (GPU), a hardware processor core, or any combination thereof, etc.), a main memory 904 (e.g., read-only memory (ROM), dynamic random-access memory (DRAM) such as synchronous DRAM (SDRAM) or Rambus DRAM (RDRAM), etc.), a static memory 906 (e.g., static random-access memory (SRAM), etc.), and a storage system 918, some or all of which may communicate with each other via a communication interface (e.g., a bus) 930. In one example, the main memory 904 includes one or more memory devices as described in examples above.

The processing device 902 can represent one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. The processing device 902 can also be one or more special-purpose processing devices such as an application specific integrated circuit (ASIC), a field programmable gate array (FPGA), a digital signal processor (DSP), network processor, or the like. The processing device 902 can be configured to execute instructions 926 for performing the operations and steps discussed herein. The computer system 900 can further include a network interface device 908 to communicate over a network 920.

The storage system 918 can include a machine-readable storage medium (also known as a computer-readable medium) on which is stored one or more sets of instructions 926 or software embodying any one or more of the methodologies or functions described herein. The instructions 926 can also reside, completely or at least partially, within the main memory 904 or within the processing device 902 during execution thereof by the computer system 900, the main memory 904 and the processing device 902 also constituting machine-readable storage media.

The term "machine-readable storage medium" should be taken to include a single medium or multiple media that store the one or more sets of instructions, or any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media. In an example, a massed machine-readable medium comprises a machine-readable medium with multiple particles having invariant (e.g., rest) mass. Accordingly, massed machine-readable media are not transitory propagating signals. Specific examples of massed machine-readable media may include: non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; and CD-ROM and DVD-ROM disks.

The machine 900 may further include a display unit, an alphanumeric input device (e.g., a keyboard), and a user interface (UI) navigation device (e.g., a mouse). In an example, one or more of the display unit, the input device, or the UI navigation device may be a touch screen display. The machine a signal generation device (e.g., a speaker), or one or more sensors, such as a global positioning system (GPS) sensor, compass, accelerometer, or one or more other sensor. The machine 900 may include an output controller, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.).

The instructions 926 (e.g., software, programs, an operating system (OS), etc.) or other data are stored on the storage system 918 can be accessed by the main memory 904 for use by the processing device 902. The main memory 904 (e.g., DRAM) is typically fast, but volatile, and thus a different type of storage than the storage system 918 (e.g., an SSD), which is suitable for long-term storage, including while in an "off" condition. The instructions 926 or data in use by a user or the machine 900 are typically loaded in the main memory 904 for use by the processing device 902. When the main memory 904 is full, virtual space from the storage system 918 can be allocated to supplement the main memory 904; however, because the storage system 918 device is typically slower than the main memory 904, and write speeds are typically at least twice as slow as read speeds, use of virtual memory can greatly reduce user experience due to storage system latency (in contrast to the main memory 904, e.g., DRAM). Further, use of the storage system 918 for virtual memory can greatly reduce the usable lifespan of the storage system 918.

The instructions 924 may further be transmitted or received over a network 920 using a transmission medium via the network interface device 908 utilizing any one of a number of transfer protocols (e.g., frame relay, internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), mobile telephone networks (e.g., cellular networks), Plain Old Telephone (POTS) networks, and wireless data networks (e.g., Institute of Electrical and Electronics Engineers (IEEE) 802.15 family of standards known as Wi-Fi®, IEEE 802.16 family of standards known as WiMax®), IEEE 802.15.4 family of standards, peer-to-peer (P2P) networks, among others. In an example, the network interface device 908 may include one or more physical jacks (e.g., Ethernet, coaxial, or phone jacks) or one or more antennas to connect to the network 920. In an example, the network interface device 908 may include multiple antennas to wirelessly communicate using at least one of single-input multiple-output (SIMO), multiple-input multiple-output (MIMO), or multiple-input single-output (MISO) techniques. The term "transmission medium" shall be taken to include any intangible medium that is capable of storing, encoding, or carrying instructions for execution by the machine 900, and includes digital or analog communications signals or other intangible medium to facilitate communication of such software.

The above detailed description includes references to the accompanying drawings, which form a part of the detailed description. The drawings show, by way of illustration, specific embodiments in which the invention can be practiced. These embodiments are also referred to herein as "examples". Such examples can include elements in addition to those shown or described. However, the present inventor also contemplates examples in which only those elements shown or described are provided. Moreover, the present inventor also contemplates examples using any combination or permutation of those elements shown or described (or one or more aspects thereof), either with respect to a particular example (or one or more aspects thereof), or with respect to other examples (or one or more aspects thereof) shown or described herein.

All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein". Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

In various examples, the components, controllers, processors, units, engines, or tables described herein can include, among other things, physical circuitry or firmware stored on a physical device. As used herein, "processor" means any type of computational circuit such as, but not limited to, a microprocessor, a microcontroller, a graphics processor, a digital signal processor (DSP), or any other type of processor or processing circuit, including a group of processors or multi-core devices.

The term "horizontal" as used in this document is defined as a plane parallel to the conventional plane or surface of a substrate, such as that underlying a wafer or die, regardless of the actual orientation of the substrate at any point in time. The term "vertical" refers to a direction perpendicular to the horizontal as defined above. Prepositions, such as "on," "over," and "under" are defined with respect to the conventional plane or surface being on the top or exposed surface of the substrate, regardless of the orientation of the substrate; and while "on" is intended to suggest a direct contact of one structure relative to another structure which it lies "on" (in the absence of an express indication to the contrary); the terms "over" and "under" are expressly intended to identify a relative placement of structures (or layers, features, etc.), which expressly includes—but is not limited to—direct contact between the identified structures unless specifically identified as such. Similarly, the terms "over" and "under" are not limited to horizontal orientations, as a structure may be "over" a referenced structure if it is, at some point in time, an outermost portion of the construction under discussion, even if such structure extends vertically relative to the referenced structure, rather than in a horizontal orientation.

The terms "wafer" is used herein to refer generally to any structure on which integrated circuits are formed, and also to such structures during various stages of integrated circuit fabrication. The term "substrate" is used to refer to either a wafer, or other structures which support or connect to other components, such as memory die or portions thereof. Thus, the term "substrate" embraces, for example, circuit or "PC" boards, interposers, and other organic or non-organic supporting structures (which in some cases may also contain active or passive components). The following detailed description is, therefore, not to be taken in a limiting sense, and the scope of the various embodiments is defined only by the appended claims, along with the full scope of equivalents to which such claims are entitled.

It will be understood that when an element is referred to as being "on," "connected to" or "coupled with" another element, it can be directly on, connected, or coupled with the other element or intervening elements may be present. In contrast, when an element is referred to as being "directly on," "directly connected to" or "directly coupled with" another element, there are no intervening elements or layers present. If two elements are shown in the drawings with a line connecting them, the two elements can be either be coupled, or directly coupled, unless otherwise indicated.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer-readable instructions for performing various methods. The code may form portions of computer program products. Further, the code can be tangibly stored on one or more volatile or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMS), read only memories (ROMs), and the like.

To better illustrate the method and apparatuses disclosed herein, a non-limiting list of embodiments is provided here:

Example 1 is a semiconductor device. The semiconductor device includes a first transmission line on a semiconductor substrate, a second transmission line in a layer above the first transmission line, the second transmission line having a line width, and a via coupled between the first transmission line and the second transmission line, wherein the via has a via width smaller than the line width, wherein the second transmission line tapers downward from the line width to the via width.

In Example 2, the semiconductor device of Example 1 optionally includes wherein the second transmission line and the via are integral.

In Example 3, the semiconductor device of any one of Examples 1-2 optionally includes wherein the second transmission line and the via include copper.

In Example 4, the semiconductor device of any one of Examples 1-3 optionally includes wherein the first transmission line is oriented orthogonal to the second transmission line.

In Example 5, the semiconductor device of any one of Examples 1–4 optionally includes wherein the first transmission line is oriented parallel to the second transmission line.

In Example 6, the semiconductor device of any one of Examples 1-5 optionally includes wherein a side of the via and a side of the second transmission line are coplanar.

Example 7 is a semiconductor device. The semiconductor device includes a first transmission line on a semiconductor substrate, a second transmission line in a layer above the first transmission line, the second transmission line having a line width, and a via coupled between the first transmission line and the second transmission line, wherein a first side of the via and a side of the second transmission line are coplanar.

In Example 8, the semiconductor device of Example 7 optionally includes wherein the via includes a second straight side opposite the first side of the via.

In Example 9, the semiconductor device of any one of Examples 7-8 optionally includes wherein the via is substantially rectangular.

In Example 10, the semiconductor device of any one of Examples 7-9 optionally includes wherein the via has a width equal to the line width.

In Example 11, the semiconductor device of any one of Examples 7-10 optionally includes wherein the first line and second line are orthogonal and define an intersection, and further including a second via at the intersection.

In Example 12, the semiconductor device of any one of Examples 7-11 optionally includes wherein the first line and second line are parallel.

Example 13 is a method. The method includes forming a first transmission line on a semiconductor substrate, forming a dielectric over the first transmission line, and using a trench mask to lithographically form a trench in the dielectric for a second transmission line above the first transmission line. The method also includes using a via mask to lithographically form a via opening in the dielectric, wherein a via mask footprint and a trench mask footprint overlap in an intersection region smaller than either the via mask or the trench mask, and wherein the via opening is dimensioned by the intersection region, and filling the trench and via opening in a single conductor deposition operation.

In Example 14, the method of Example 13 optionally includes wherein the trench is formed before the via opening.

In Example 15, the method of any one of Examples 13-14 optionally further includes etching within the trench and the via opening concurrently, forming a downward taper from one side of the trench to the via opening.

In Example 16, the method of any one of Examples 13-15 optionally includes wherein using a via mask to lithographically form a via opening includes the intersection region spanning a width of the trench mask.

In Example 17, the method of any one of Examples 13-16 optionally includes wherein using a via mask to lithographically form a via opening includes using a single via mask to form two or more adjacent intersection regions to form two or more adjacent via openings.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. A semiconductor device, comprising:
   a first transmission line on a semiconductor substrate;
   a second transmission line in a layer above the first transmission line, the second transmission line having a line width; and
   a via coupled between the first transmission line and the second transmission line, wherein the via has a via width smaller than the line width;
   wherein the second transmission line tapers downward from the line width to the via width.

2. The semiconductor device of claim 1, wherein the second transmission line and the via are integral.

3. The semiconductor device of claim 1, wherein the second transmission line and the via include copper.

4. The semiconductor device of claim 1, wherein the first transmission line is oriented orthogonal to the second transmission line.

5. The semiconductor device of claim 1, wherein the first transmission line is oriented parallel to the second transmission line.

6. The semiconductor device of claim 1, wherein a side of the via and a side of the second transmission line are coplanar.

7. A semiconductor device, comprising:
   a first transmission line on a semiconductor substrate;
   a second transmission line in a layer above the first transmission line, the second transmission line having a line width; and
   a via coupled between the first transmission line and the second transmission line;
   wherein a first side of the via and a side of the second transmission line are coplanar.

8. The semiconductor device of claim 7, wherein the via includes a second straight side opposite the first side of the via.

9. The semiconductor device of claim 7, wherein the via is substantially rectangular.

10. The semiconductor device of claim 7, wherein the via has a width equal to the line width.

11. The semiconductor device of claim 7, wherein the first line and second line are orthogonal and define an intersection, and further including a second via at the intersection.

12. The semiconductor device of claim 7, wherein the first line and second line are parallel.

13. A method, comprising:
    forming a first transmission line on a semiconductor substrate;
    forming a dielectric over the first transmission line;
    using a trench mask to lithographically form a trench in the dielectric for a second transmission line above the first transmission line;
    using a via mask to lithographically form a via opening in the dielectric, wherein a via mask footprint and a trench mask footprint overlap in an intersection region smaller than either the via mask or the trench mask, and wherein the via opening is dimensioned by the intersection region; and
    filling the trench and via opening in a single conductor deposition operation.

14. The method of claim 13, wherein the trench is formed before the via opening.

15. The method of claim 13, further including etching within the trench and the via opening concurrently, forming a downward taper from one side of the trench to the via opening.

16. The method of claim 13, wherein using a via mask to lithographically form a via opening includes the intersection region spanning a width of the trench mask.

17. The method of claim 13, wherein using a via mask to lithographically form a via opening includes using a single via mask to form two or more adjacent intersection regions to form two or more adjacent via openings.

* * * * *